(12) United States Patent
Wang

(10) Patent No.: US 8,358,858 B2
(45) Date of Patent: Jan. 22, 2013

(54) MATRIX COMPRESSION ARRANGEMENTS

(75) Inventor: Jimmy Xiaoji Wang, Edinburgh (AU)

(73) Assignee: The Commonwealth of Australia, Edinburgh (AU)

( * ) Notice: Subject to any disclaimer, the term of this patent is extended or adjusted under 35 U.S.C. 154(b) by 966 days.

(21) Appl. No.: 11/916,269

(22) PCT Filed: Jun. 5, 2006

(86) PCT No.: PCT/AU2006/000759
§ 371 (c)(1),
(2), (4) Date: Jun. 27, 2008

(87) PCT Pub. No.: WO2006/128251
PCT Pub. Date: Dec. 7, 2006

(65) Prior Publication Data
US 2008/0273588 A1  Nov. 6, 2008

(30) Foreign Application Priority Data

Jun. 3, 2005 (AU) ............................... 2005902870

(51) Int. Cl.
*G06K 9/46* (2006.01)
(52) U.S. Cl. ......................... 382/232; 382/233; 382/239
(58) Field of Classification Search ........... 382/232–253
See application file for complete search history.

(56) References Cited

U.S. PATENT DOCUMENTS

| | | |
|---|---|---|
| 5,123,017 A | 6/1992 | Simpkins et al. |
| 6,337,881 B1 | 1/2002 | Chaddha |
| 6,480,810 B1 | 11/2002 | Cardella et al. |
| 6,549,672 B1 * | 4/2003 | Kondo et al. ................. 382/239 |
| 6,597,991 B1 * | 7/2003 | Meron et al. ...................... 702/3 |
| 6,609,051 B2 | 8/2003 | Fiechter et al. |
| 7,308,147 B2 * | 12/2007 | Sano ............................. 382/236 |
| 7,471,839 B2 * | 12/2008 | Moreira ........................ 382/240 |
| 7,672,523 B2 * | 3/2010 | Yeung et al. .................. 382/239 |
| 2001/0024529 A1 * | 9/2001 | Chao et al. .................... 382/240 |
| 2003/0059121 A1 * | 3/2003 | Savakis et al. ................ 382/239 |
| 2004/0136570 A1 * | 7/2004 | Ullman et al. ................ 382/114 |

(Continued)

FOREIGN PATENT DOCUMENTS

WO   WO 01/43074 A1   6/2001

OTHER PUBLICATIONS

Kicken, P.H.M, "Implementing the ADRC algorithm within an MPEG-2 video decoder", May 5, 1997, Philips Semiconductors / Eindohoven University of Technology, pp. 1-70.*

(Continued)

*Primary Examiner* — Chan S Park
*Assistant Examiner* — David Perlman
(74) *Attorney, Agent, or Firm* — Knobbe Martens Olson & Bear, LLP

(57) ABSTRACT

This invention relates to utilizing image compression and reconstruction algorithms for transmission and reception of data that can be represented as a numerical matrix or a sequence of numerical matrices in bandwidth limited channels. The method and algorithms described herein may reduce data size to such an extent that data that was considered too large to be practically transmitted in a useful time frame can be transmitted in real or near real time. The algorithms can be applied to data communications for a variety of sensor, electronic and information systems.

14 Claims, 2 Drawing Sheets

U.S. PATENT DOCUMENTS

2004/0174378 A1  9/2004  Kadono et al.

OTHER PUBLICATIONS

Jacoby, Keith, "Characterizing the Effect of Spatial Translations on JPEG-compressed Images", May 1998, Rochester Institute of Technology, Center for Imaging Science, pp. 1-20.*

Supplementary European Search Report dated Mar. 11, 2009 for related Application No. EP 06 74 1176.

Anonymous. "Contrast Stretching" (online). Jan. 31, 2001. http://academic.mu.edu/phys/matthysd/web226/Lab01.htm. Retrieved on Aug. 6, 2009.

Anonymous. "JPEG" (online). Jan. 29, 2005. http://en.wikipedia.org/wiki/Jpeg. Retrieved on Aug. 6, 2009.

International Search Report and Written Opinion of ISA dated Aug. 16, 2006 for PCT/AU2006/000759 filed on Jun. 5, 2006.

* cited by examiner

MATRIX COMPRESSION ARRANGEMENTS

This invention, relates to utilising image compression and reconstruction algorithms for transmission and reception of data that can be represented as a numerical matrix or a sequence of numerical matrices in bandwidth limited channels. The method and algorithms described herein may reduce data size to such an extent that data that was considered too large to be practically transmitted in a useful time frame can be transmitted in real or near real time. The algorithms can be applied to data communications for a variety of sensor, electronic and information systems.

BACKGROUND OF THE INVENTION

This specification describes an advance in the compression and reconstruction of data that can typically be represented as a matrix or a sequence of matrices. Each matrix may then be represented graphically. Such data is typically analysed and represented in one or more ways to assist in its interpretation by a human or a computer programmed to provide assistance in such matters. Such data could relate to a multitude of matters.

It is a truism that the larger the amount of data collected by one or more sensors the more accurate and useful the analysis of that data into information will be. Therefore, it is one thing to collect data that once analysed could be of use, the challenge is often how the data collected is going to be communicated to where it can be analysed and then used in the most appropriate manner.

Low data communication bandwidths exist for one or more reasons for many communications systems and the data to be transmitted can thus take inordinate periods of time to transmit because of the low data rate achievable on the channel. Even when communication channels of adequate bandwidth are available, the priority of the data may be such that it is not of adequate benefit to devote that available bandwidth to the task of communicating the data to where it may be of greatest value.

In this specification a potential solution to this problem is described that uses compression and reconstruction algorithms to enable the transmission of data that can be represented as a numerical matrix or a sequence of images, this is true for any data that can be represented as a numerical matrix or a sequence of matrices. The algorithms disclosed may reduce data size for some applications to such an extent that sensors or electronic systems that were considered to provide so much data as to be impractical for transmission on available channels in a useful time frame can now transmit their data in real time or within an acceptable time.

BRIEF DESCRIPTION OP THE INVENTION

In a broad aspect of the invention a method of compression of digital data representative of a first numerical matrix, said representation containing scalable data, the method consisting of the steps of: a) creating a representation of a scale associated with said first numerical matrix, and b) compressing said digital data representative of said first numerical matrix and associating a representation of said scale with said compressed data.

In a broad aspect of the invention a method of reconstructing digital data representative of a first numerical matrix containing scalable data, the method consisting of the steps of: c) receiving compressed data representative of said first numerical matrix and receiving a representation of a scale associated with said first numerical matrix representation, d) decompressing said data representative of said first numerical matrix: and e) mapping said decompressed data with said representation of said scale to reconstruct data representative of said first numerical matrix.

In a preferred aspect of the invention the step of creating a representation of a scale includes the step of determining the maximum and minimum values of said digital data representative of said numerical matrix and creating a representation of those values, which are the values themselves or a ratio of those values.

In yet a further aspect of the invention a method of reconstruction of the first numerical matrix includes the further step of: applying said values themselves or the ratio of those values to each decompressed data value to provide data representative of a version of said first numerical matrix wherein N is a matrix with real number entries, and x and y are the maximum and minimum entries of N respectively which represent the first numerical matrix, A is a matrix of the same size that represents the compressed first numerical matrix file of N and a and b are the maximum and minimum entries of A respectively, the matrix P, the reconstruction of matrix N from the compressed numerical matrix A, of the same size can is constructed so that its i-th row and j-th column entry are:

$$P(i, j) = \frac{(A(i, j) - b)(x - y)}{a - b} + y.$$

such that P has the property of $\max\{P(i, j)$, all i and $j\}=x$, $\min\{P(i, j)$, all i and $j\}=y$ to create a numerical matrix substantially the same as the original.

In a further aspect of the invention a method according to any preceding claim wherein said first matrix consists of a plurality of data points the method consists of the further step of determining the quality of the reconstructed data measured by the mean error and standard deviation in a set of data points of the difference of an data point from the first numerical matrix compared with a reconstructed data point.

In a further aspect of the invention the method consists of the further step of predetermining the quality factor for the compression or compression ratio so as to allow the transmission of data through the available bandwidth and determining the quality of the data reconstructed with the chosen quality factor.

In a further aspect of the invention the method consists of the further step of predetermining the quality factor for the compression so as to allow the transmission of data through a predetermined data transmission bandwidth and predetermining the quality of the data reconstructed with the predetermined quality factor.

In yet a further aspect of the invention the method consists of the further step of: determining the largest quality factor for compression of the first numerical matrix based on the largest data transmission bandwidth available for transmission of data representing the compressed first numerical matrix.

In a further aspect of the invention the method consists of the further step of determining the largest or smallest quality factor for compression of the first numerical matrix based on predetermined upper bounds of mean error and standard deviation of the value of a data point in a reconstructed first numerical matrix.

In a further aspect of the invention the method consists of the further step of: determining the size of the compressed data; and determining the bandwidth of the data transmission required for transmission of data representing the compressed first numerical matrix.

In a further aspect of the invention the data compression algorithm is JPEG2000.

In yet a further aspect of the invention the data consists of a sequence of sub-data sets, where each sub-data set can be represented as a numerical matrix and each sub-data set is intended to be transmitted to a remote user in real-time or near real-time.

The methods described herein can be used in conjunction with data communications algorithms such as those utilising short messages which are the subject of a separate patent application in the name of the same applicant and filed on the same day under the title of Messaging Method as this specification and which is incorporated herein by reference.

A specific embodiment of the invention will now be described in some further detail with reference to and as illustrated in the accompanying figures. This embodiment is illustrative and it should not restrict the scope of the invention or its application in other environments or applications. Suggestions and descriptions of other embodiments may be included within the scope of the invention but they may not be illustrated in the accompanying figures or alternatively features of the invention may be shown in the figures but not described in the specification.

DETAILED DESCRIPTION OF AN EMBODIMENT OF THE INVENTION

Figure 1:
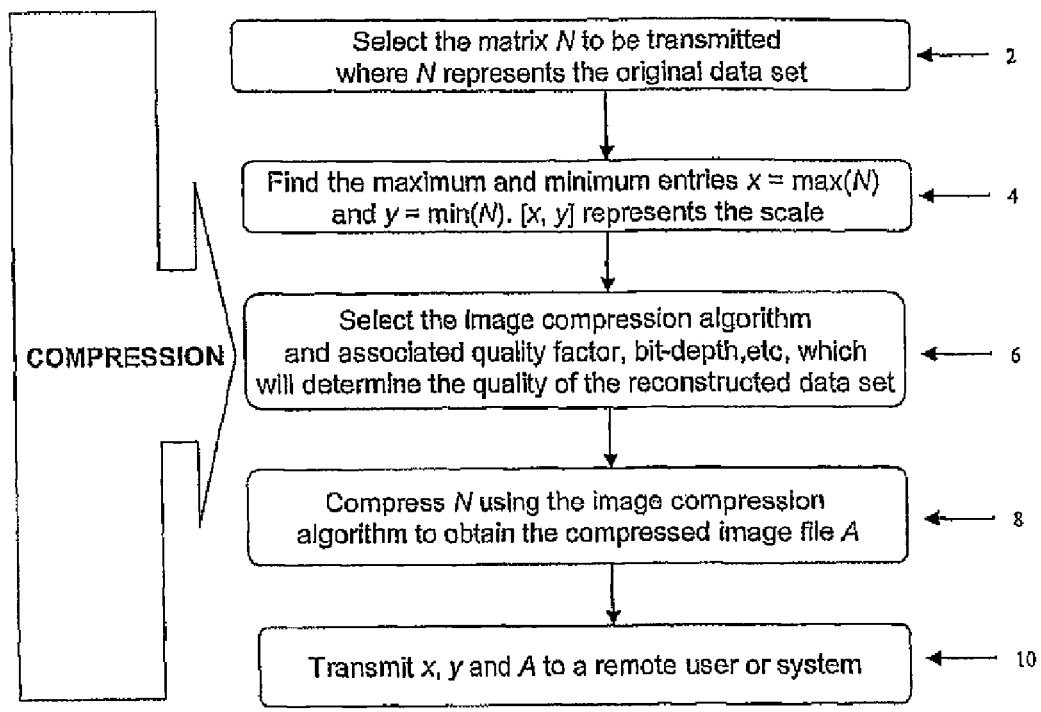
FIG. 1 depicts steps for the compression of a data matrix.

In this specification, the disclosure describes a way to reduce the quantity of data sent from sensors or electronic systems that can be distributed across to and between the nodes of a network through use of numerical matrix compression and reconstruction steps that use one or more compression and reconstruction algorithms.

To enable less data than was originally created by a sensor to be sent over a communications link it is necessary to firstly compress the available data at the sending end of the link and then finally once the compressed data is received at the other receiving end of the link to reconstruct the original data from the compressed received data and the quality of the reconstruction can be controlled between faithful reproduction of the original data to useful reproduction having acceptable deficiencies referred to as a quality control factor that can be set by the user to suit the purposes at hand. The link is left to ensure that all of the compressed data has been accurately transmitted over the link and in the event that the quality of the link causes errors or omissions of data received then the quality of the reconstruction may be further reduced.

A ratio of the quantity of sent data over the quantity of original data is preferably as low as possible and when the described methods and algorithms are used, the low ratios obtained are such that quantities of data that were considered to be too large to be practically transmitted to other users or systems in a useful time frame can now be transmitted in real or near real time while retaining the critical characteristics of the original data.

The methods disclosed are applicable to data communications applications for a variety of electronic and information systems. Statistical analysis of the methods and algorithms is provided in this specification to quantify the difference between the original data and the reconstructed data that become available at the remote system or user (in the main the end user is referred to herein but this is not intended to limit the scope of the description or the claims appended hereto when the end point could be a remote system).

Various values of quality control factor can be applied in the compression algorithms described herein so as to achieve various data size reductions, keeping in mind that extreme quality control reductions could affect the usability of the recovered data even though the smaller data sizes are more amenable to the available communication bandwidths.

One feature of the methods and algorithms presented in this specification is that the reconstruction process preserves predetermined aspects of the original data, which could in one example be the maximum and minimum signal reading levels of a sensor. The preservation of this type or characteristic in a sensor data collection and distribution process allows the end user to undertake the typical processing available at a network node, so that even though the data size of communicated data is substantially lower than was the prior case, the user does not treat the data any differently to provide the same end result as if the original digital representation of the original data was available to them.

The analysis provided in this specification shows that when the data is a numerical matrix which has a plurality of data points wherein the numerical matrix represents an image, its reconstructed numerical matrix representation is not substantially different to the original data representation of the numerical matrix so the practical effect is that there is no significant difference to the outcome of the task performed by the remote system or user.

Matrix Compression and Reconstruction

Compression and reconstruction algorithms for any data set that can be represented, as a matrix or a sequence of matrices is described. Such data can for example be represented as an image or a sequence of images. Image compression and reconstruction algorithms are discussed to assist the reader but are not intended to limit the scope of the claimed invention. A rigorous statistical analysis of the errors caused by the compression and reconstruction algorithms is also provided with mathematical measures for the errors provided and again analysis is used to assist the reader to better appreciate the benefits of the methods and algorithms described by way of example in this specification. The mathematical measures described are in no way intended to limit the scope of the claimed invention.

Compression and Reconstruction of Data Matrices

By way of example, two types of data are considered: i) single data set that can be represented as a numerical matrix; and ii) data that consists of a sequence of sub-data sets, where each sub-data set pan be represented as a numerical matrix; each sub-data set is intended to be transmitted to a remote user in real-time or hear real-time; wherein the received sub-data set may or may not be manipulated to generate desired data forms.

If one can transmit, without any errors, a data set that can be represented as a numerical matrix produced by system A to a remote end user B, then end user B will have the same information as that at system A. As a matter of fact, B will have the capacity to generate all the desired data formats, exactly as the information generator at system A can do. Thus theoretically, after receiving the error-free numerical matrices, the end user B has exactly the same information as the system that generates the numerical matrices. This would be the ideal case when there is ample communication bandwidth available for this purpose between system A and end user B. However, for many applications, the communication bandwidth is often limited, which requires exploration of the possibilities for reducing the size of the data to be transmitted so as to cater for the available communication bandwidth, at the same time, maintaining the quality of the received data to a level acceptable to the end user.

In an example, a numerical matrix F can represent an image in system A or generated in system A. An image compression algorithm can be applied to reduce the size of the data representing the image and thus a smaller version of the image can be transmitted through the communication channel to the end user. Upon receipt of the compressed image, data the end user could then convert the received data back into a numerical matrix G.

However it is not enough to merely compress the image by applying known compression algorithms because this process is typically a lossy transformation which discards information in the original data that is not recoverable when the transformation is reversed by a decompression and by way of example it may be that one or more signal levels contained in the image are lost or distorted. If a reconstruction process is to be applied so as to preserve such information then the compression algorithm should ideally not discard the relevant information in the first place. Known image compression algorithms however do not discriminate between one part of an image and another so there will be a possibility that signal reading level will be affected and become unrecoverable.

Furthermore although non-lossy compression techniques exist they output data files still too large for transmission in the real or near real time periods desirable.

With appropriate selection of the compression algorithm, the method of the invention includes applying the selected algorithm and its associated quality control factor and the difference between F and G, after the reconstruction (recompression) process, can be controlled to a level that is acceptable to the end user while preserving critical signal level values.

A number of compression algorithms as described herein may be utilised to compress digital data represented in image format.

Image compression algorithms utilising JPEG2000 (Joint Photographic Experts Group 2000) format have been widely used in the compression of many types of images with great success. It employs the mathematical tool wavelets instead of discrete cosine transforms. Wavelets have been applied in a number of areas taking advantage of their inherent power of examining the details of a signal at multiple levels. When compressing an image using JPEG2000 that is just a numerical matrix, a parameter called Quality Factor (QF) can be set. This QF will determine the compression rate, and thus the quality of the recompressed image. QF can range between the values of 0 and 100. The recompressed image quality increases with an increase of the QF used when compressing the original image. In accordance with this invention, so as to preserve critical signal levels, the compressed image has scaled signal-reading values ranging from 0 to $2^p$ for any QF where p is the bit-depth selected.

There are many other usable image compression algorithms some of which are PNG (Portable Network Graphics), GIF (Graphic Interchange Format), TIFF (tagged Image File Format), PDF (Portable Document Format), BTPC (Binary Tree Predictive Coding), EPIC (Efficient Pyramid Wavelet Coder), Hcompress (wavelet image compression) and DCT (Discrete Cosine Transforms) algorithms.

Referring to the flow chart of FIG. 1 the steps for the compression of a data matrix are illustrated.

The first step, Step 2 is to select the matrix N to be transmitted, where N represents the original data set which contains data points.

Step 4 is to find the maximum and minimum entries x=max (N) and y=min (N) of scalable data in the matrix.

Step 6 is to select the image compression algorithm and associated quality factor and if required the bit depth.

Step 8 is to compress N using a selected image compression algorithm to obtain a compressed image file A.

Step 10 is to transmit x, y and A to a receiver being a remote user, node or system.

The invention deals with the potential loss of predetermined essential information. This leads to the next phase, namely, image reconstruction, which involves the mapping of certain predetermined values (such as for example maximum and minimum signal level readings) of the compressed image back into the range of those of the original data matrix. The following is a generic procedure that can be applied to the reconstruction process of any compressed image utilising an image compression algorithm.

The Mapping Procedure/or the Reconstruction of a Compressed Image:

Let N be a matrix with real number entries, and let x and y be the maximum and minimum entries of N respectively. Let A be the matrix of the same size that represents the compressed image file of N and let a and b be the maximum and minimum entries of A respectively. The matrix P, the reconstruction of matrix N from the compressed image A, of the same size can then be constructed in such a way that its i-th row and j-th column entry are as follows:

$$P(i, j) = \frac{(A(i, j) - b)(x - y)}{a - b} + y. \quad (1)$$

Where P will have such properties as max{P(i, j), all i and j}=x, min{P(i, j), all i and j}=y and B=N−P the difference of N and P contains only the errors introduced by the compression algorithm and the quantisation process.

Equation (1) defines a linear mapping which does not introduce any additional error. In the whole image compression and reconstruction process, there are only two stages involved, namely, compression with quantisation being part of the process and reconstruction using equation (1). Therefore, non-zero entries of B are the result of the errors caused by the compression algorithm, which is the loss of information due to the compression algorithm used to reduce the data size, and the consequent quantisation of data in the original matrix.

If N is transmitted to an end user, B may also contain errors caused by the communication channel used for the transmission.

Figure 2:
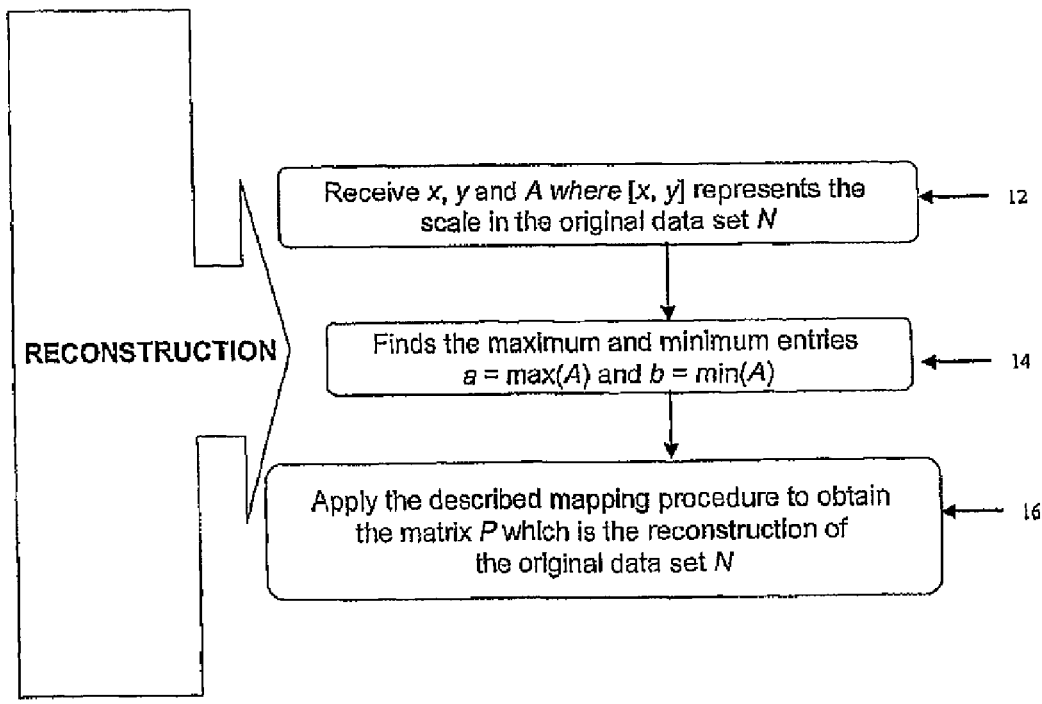
FIG. 2 depicts steps for the reconstruction of a data matrix.

The flow chart of FIG. 2 illustrates steps for the reconstruction of a data matrix.

The first step, Step 12 is to receive x, y and A (compressed image file) where [x, y] represents the scale in the original data set N.

Step 14 is where the receiver determines the maximum and minimum entries a=max (A) and b=min (A).

Step 16 is where the receiver applies the described mapping procedure of the reconstruction of a compressed numerical matrix to obtain a matrix P the reconstruction of matrix N.

Mathematical Measures for Quantifying the Difference

The difference between the reconstructed matrix and the original matrix depends upon the compression algorithm employed and the quality control factor chosen. Provided below are mathematical measures to quantify the difference. Let $$C = abs(B) = abs(N-P). \quad (2)$$

that is, a matrix of the same size as B with each entry being the absolute value of the corresponding entry of B. C gives absolute error of the signal reading value for each pixel between the original image and the reconstructed one. Then it is possible to calculate the mean and variance of the entries of C that are the mean and variance of the errors in a pixel. If there are a number of images of the same type available, it is possible to go through the compression and reconstruction process for all images available and then calculate mean and variance for all entries of all the images. Since the number of samples is much larger, the mean and variance are expected to be more statistically consistent.

Another way to examine the difference between the original data set and the one obtained from the reconstruction of the compressed data is to define a measure $$B=N-P. \quad (3)$$

It is possible to evaluate the mean and standard deviation of the entries of B that represents the difference between the original and the reconstructed data sets.

The statistical distribution of the entries of B can be estimated. If it is approximately a normal distribution, the probabilities that the error in a data point (which, for example using an image as the source of the numerical matrix equates a pixel value to a data point value) falls into various gates can be obtained. For a normal distribution $N(\mu,\sigma)$, the probabilities of a data point falling within the interval $[\mu-k\sigma,\mu+k\sigma]$ are 0.6827, 0.9543 and 0.9973 respectively for k=1, 2 and 3. Let V be numerical value at a pixel in the original data, then V' the numerical value at the same pixel in the reconstructed data set satisfies $$V+\mu-k\sigma \leq V' \leq V+\mu+k\sigma \quad (4)$$

with probability 0.6827, 0.9543 and 0.9973 for k=1, 2 and 3 respectively, $\mu-k\sigma$, $\mu+k\sigma$ key and the upper bound that is defined as $\max\{|\mu-k\sigma|, |\mu+k\sigma|\}$ for k=1, 2 and 3 can be evaluated with the estimated $\mu$ and $\mu$.

For a given data format, the compression and reconstruction process can be applied to the data set or all the sub-data sets with a suitable range of QFs. The compressed file sizes for all the QFs can be recorded and used for the selection of appropriate QF such that the compressed data can be transmitted using a communications link with a particular bandwidth. The data point (pixel) error mean and standard deviation between the original data set and the one obtained from the reconstruction of the compressed data may also be derived.

If the communication bandwidth is known, one can find the largest QF value such that the file size of the compressed data using JPEG2000 with that QF value is less than the known bandwidth. Then one can find the mean error and standard deviation in a pixel in the reconstructed data for that QF value.

On the other hand, one may set upper bounds that are appropriate for a particular application based on the mean error and standard deviation in a data point (pixel) in the reconstructed data. One may find the smallest QF value such that the mean and standard deviation in a data point (pixel) in reconstructed form is within the set bounds. One can then find out the mean compressed data size that can be used to identify the communication bandwidth requirement for this application. That is, the algorithms can be customised for specific applications.

Figure 3:
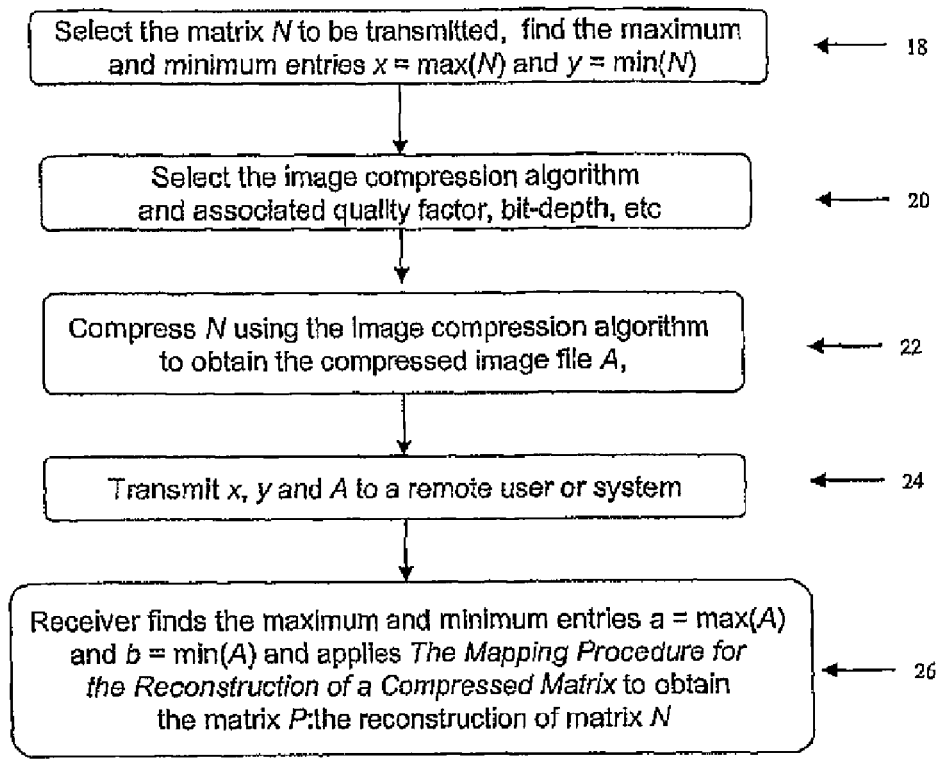
FIG. 3 depicts an embodiment of the flow diagram of the method of the invention.

The flow chart of FIG. 3 illustrates the steps for the compression and reconstruction of a data matrix.

Step 18 is to select the matrix N to be transmitted, and then find the maximum and minimum entries x=max (N) and y=min (N) of the scalable data in the matrix.

Step 20 is to select the image compression algorithm and associated quality factor and if required the bit depth, etc.

Step 22 is to compress N using the image compression algorithm to obtain the compressed image file A.

Step 24 is to transmit x, y and A to a receiver being a remote user, node or system.

Step 26 is where the receiver determines the maximum and minimum entries a=max (A) and b=min (A) and applies the described mapping procedure of the reconstruction of a compressed numerical matrix, which may be represented as a digital image, to obtain a matrix P the reconstruction of matrix N.

In an embodiment a method of compression of digital data representative of a numerical matrix such as an image containing scalable data is used and the method consists of the steps; a) creating a representation of a scale associated with the numerical matrix; b) compressing the digital data representative of the numerical matrix; and c) associating a representation of the scale with the compressed data.

In the above embodiment the method of reconstructing digital data representative of a numerical matrix containing scalable data, consists of the steps of a) receiving compressed data representative of the numerical matrix, b) receiving a representation of a scale associated with the numerical matrix representation, c) decompressing the data representative of the numerical matrix and d) mapping the data with the representation of the scale to create a version of the data representative of the numerical matrix.

The step of creating a representation of a scale includes the step of determining the maximum and minimum values of the digital data representative of said numerical matrix and creating a representation of those values, which are the values themselves or a ratio of those values.

Figure 4:
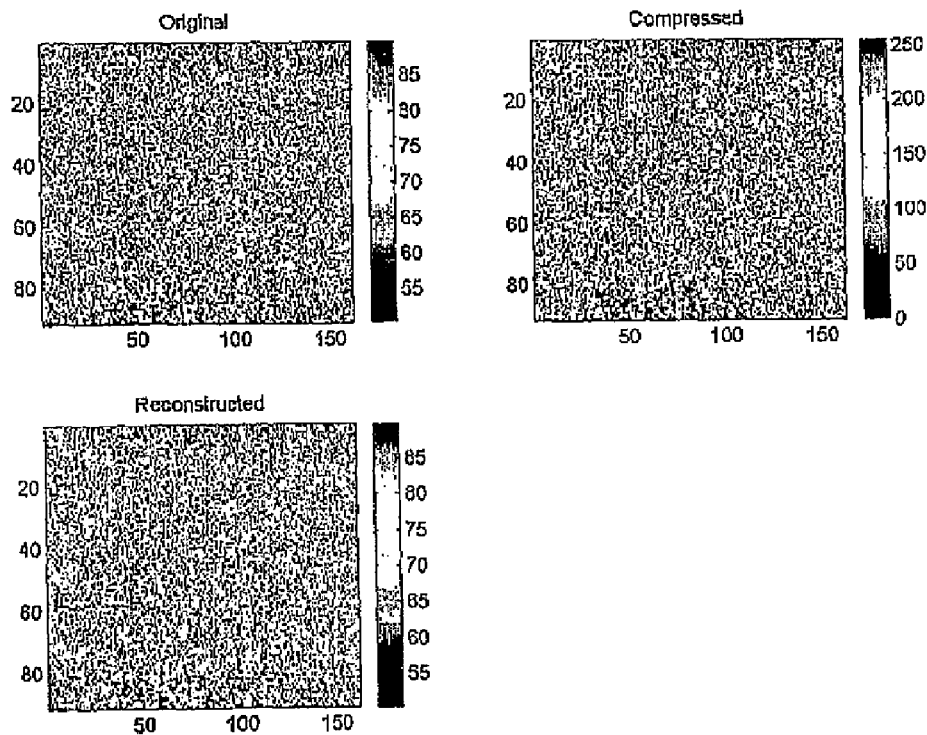
FIG. 4 illustrates an example of the original, compressed and reconstructed data sets using the method of the invention.

An example is provided below to illustrate the effect of the matrix compression algorithm on an image which can be represented as a numerical matrix M having 90 rows and 160 columns. The entries of M are all positive real numbers with maximum and minimum entries 49.76 and 91.05 respectively as determined from the scale shown on the right hand side of the top left plot in FIG. 4 (marked "original"), which is a graphical presentation of M. The top right plot of FIG. 2 (marked "compressed") is the compressed image file of M using JPEG2000 with QF=16 and bit-depth 8. As indicated on the scale on the right hand side of the compressed image, the entries in the compressed file ranges from 0 to 255. The bottom plot in FIG. 4 (marked "reconstructed") shows the reconstructed matrix data that is essentially the same as the original data matrix M since the mean and standard deviation of the difference are 0.21 and 0.27 respectively. The file size of M is 118 Kbytes while that of the reconstructed data is only 2.66 Kbytes. That is the compressed data is approximately 1/50 of the size of M requiring much less bandwidth to transmit but when reconstructed holds the essential information that makes the image usable by the receiver.

These techniques can be applied to data generated by a variety of sensor, electronic and information systems. Thus potential applications of the algorithms described herein include but are not limited to, exchanging sensor, electronic and information systems data among the nodes of a network connected through various communication means. The various communication channels may include optic fibre or wire cables, RF links and satellite up/down links with different availability, bandwidth and reliability. The compression and reconstruction algorithms enable a useful reduction of the size of data to be transmitted and hence make it possible for the exchange of data generated by such systems in real time or close to real time or at least offer an alternative to current techniques.

It will be appreciated, by those skilled in the art that the invention is not restricted in its use to the particular application described. Neither is the present invention restricted in its preferred embodiment with regard to the particular elements and/or features described or depicted herein. It will be appreciated that various modifications can be made without depart- The claims defining the invention are as follows:

1. A method of compression of a first numerical matrix, the first numerical matrix being a matrix representation of a dataset and comprising a plurality of data points, the method comprising the steps of:
   - determining the global maximum (x) and global minimum (y) values of the data points in the first numerical matrix;
   - creating a representation of a scale of the first numerical matrix, said representation selected from the group consisting of (x,y), (x/y) or (y/x);
   - compressing said first numerical matrix using an image compression algorithm to obtain a compressed image file, the image representation of the compressed image file having a global maximum (a) and global minimum (b) wherein (x-y) is different to (a-b); and
   - providing the representation of scale and the compressed image file to a transmitter so as to allow a receiving system to reconstruct the first numerical matrix.

2. The method as claimed in claim 1, wherein $a=2^P$ and $b=0$, and P is the bit depth of the compressed file.

3. The method as claimed in claim 1 wherein the method comprises the further step of:
   - predetermining a quality factor for the compression so as to allow the transmission of data through a predetermined data transmission bandwidth and predetermining the quality of the data reconstructed from the data that was compressed with the predetermined quality factor.

4. The method as claimed in claim 1, further comprising the steps of:
   - decompressing the compressed image file;
   - mapping the decompressed image file with the representation of scale to reconstruct data representative of the dataset; and
   - determining the quality of the reconstructed data measured by the mean error and standard deviation in a set of data points of the difference of an data point from the first numerical matrix compared with a reconstructed data point.

5. The method as claimed in claim 1, further comprising the step of:
   - determining the largest quality factor for compression of the first numerical matrix based on the largest data transmission bandwidth available for transmission of data representing the compressed first numerical matrix.

6. The method as claimed in claim 1, further comprising the step of:
   - determining the largest or smallest quality factor for compression of the first numerical matrix based on predetermined upper bounds of mean error and standard deviation of the value of a data point in a reconstructed first numerical matrix.

7. The method as claimed in claim 6 wherein the method comprises the further step of:
   - determining the size of the compressed image file; and
   - determining the bandwidth of the data transmission required for transmission of data representing the compressed first numerical matrix.

8. The method as claimed in claim 1, wherein JPEG2000 is used to compress digital data.

9. A method of compressing and transmitting a dataset, wherein the dataset may be represented as a sequence of sub-data sets, where each sub-data set is represented as a numerical matrix, and each numerical matrix representing each sub-data set is compressed according to the method of claim 1, and each compressed image file and associated representation of scale is transmitted to a remote system or user in real-time or near real-time.

10. A method of reconstructing data representative of a first numerical matrix, the first numerical matrix being a matrix representation of a dataset and comprising a plurality of data points, the method comprising the steps of:
    a) receiving a compressed image file;
    b) receiving a representation of a scale of the first numerical matrix from the group consisting of (x,y), (x/y) or (y/x) wherein x is the global maximum of the first numerical matrix and y is the global minimum of the first numerical matrix;
    c) decompressing said received image file to obtain an image representation of the decompressed image file having a global maximum (a) and global minimum (b) wherein (x-y) is different to (a-b); and
    d) mapping said image representation with said representation of said scale to reconstruct data representative of said first numerical matrix.

11. The method as claimed in claim 10, further comprising the step of:
    applying said received representation of scale to each decompressed data value to provide data representative of a version of said first numerical matrix wherein the first numerical matrix is a matrix N with real number entries, and x and y are the maximum and minimum entries of N respectively, the received decompressed image file is a matrix A of the same size as N and a and b are the maximum and minimum entries of A respectively, the matrix P, the reconstruction of matrix N from the matrix A, of the same size as matrices N and A and which is constructed so that its i-th row and j-th column entry are:

$$P(i, j) = \frac{(A(i, j) - b)(x - y)}{a - b} + y.$$

such that P has the property of $\max\{P(i, j), \text{all } i \text{ and } j\}=x$, $\min\{P(i, j), \text{all } i \text{ and } j\}=y$ to create a numerical matrix substantially the same as the first numerical matrix.

12. The method as claimed in claim 11 wherein the data representative of a first numerical matrix consist of successive matrices of a sensor or electronic system that create data sets representative of characteristics detected by the sensors or electronic systems.

13. The method as claimed in claim 10, comprising the further step of:
    determining the quality of the reconstructed data measured by the mean error and standard deviation in a set of data points in the first numerical matrix of the difference of an original data point compared with a reconstructed data point.

14. The method of claim 1, wherein the dataset comprises non-image data.

* * * * *